(12) United States Patent
Slivka

(10) Patent No.: US 11,861,096 B2
(45) Date of Patent: Jan. 2, 2024

(54) WALL MOUNTED CONTROL DEVICE WITH TACTILE AND TOUCH SENSING BUTTON COMBINATION TO INCREASE BUTTON CONFIGURATIONS

(71) Applicant: Crestron Electronics, Inc., Rockleigh, NJ (US)

(72) Inventor: Benjamin M. Slivka, Hillsdale, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

(21) Appl. No.: 18/116,380

(22) Filed: Mar. 2, 2023

(65) Prior Publication Data

US 2023/0205352 A1 Jun. 29, 2023

Related U.S. Application Data

(63) Continuation of application No. 17/555,273, filed on Dec. 17, 2021, now Pat. No. 11,640,216.

(60) Provisional application No. 63/127,991, filed on Dec. 18, 2020.

(51) Int. Cl.
*G06F 3/041* (2006.01)
*G06F 3/02* (2006.01)
*G06F 3/01* (2006.01)

(52) U.S. Cl.
CPC ............ *G06F 3/0416* (2013.01); *G06F 3/016* (2013.01); *G06F 3/02* (2013.01)

(58) Field of Classification Search
None
See application file for complete search history.

(56) References Cited

U.S. PATENT DOCUMENTS

2016/0349823 A1* 12/2016 Killo ................. F24F 11/61
2017/0024020 A1* 1/2017 Kirkpatrick ........... G06F 3/0238

* cited by examiner

*Primary Examiner* — Stephen T. Reed
(74) *Attorney, Agent, or Firm* — Crestron Electronics, Inc.

(57) ABSTRACT

A control device comprising a front portion, at least one button cap, and a controller. The front portion comprises a plurality of button zones each comprising a tactile switch and at least one touch sensor. The at least one button cap is adapted to attach to the control device over at least one of the button zones such that the at least one button cap is positioned over the at least one touch sensor and interacts with the tactile switch in the at least one of the button zones. The controller determines which button zone and which location of the button zone is actuated in response to a combination of signals received from at least one of the tactile switches and at least one of the touch sensors.

21 Claims, 13 Drawing Sheets

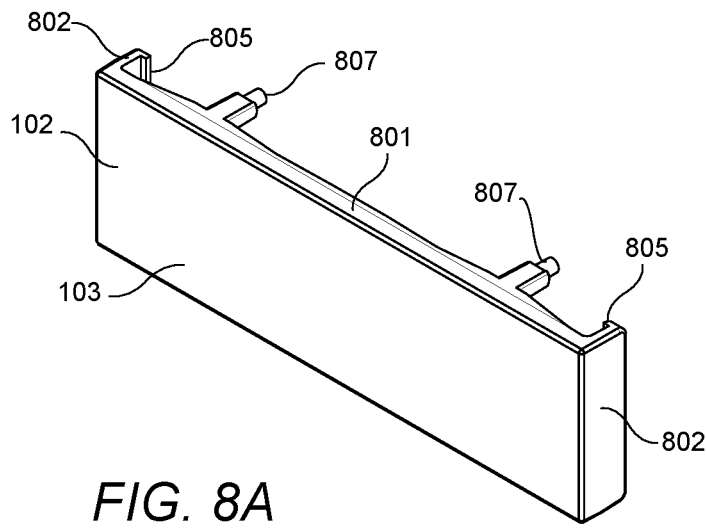
FIG. 8A
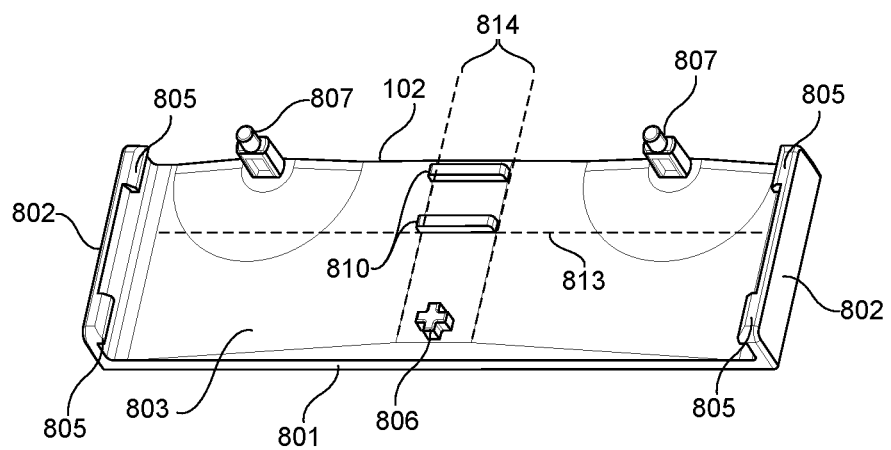
FIG. 8B
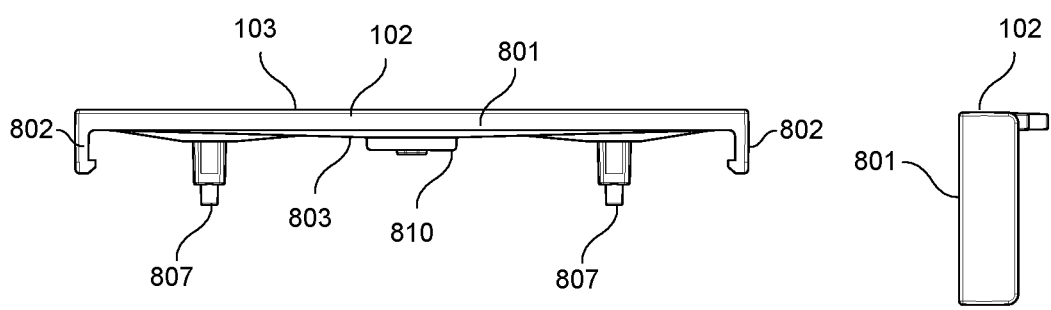
FIG. 8C
FIG. 8D

WALL MOUNTED CONTROL DEVICE WITH TACTILE AND TOUCH SENSING BUTTON COMBINATION TO INCREASE BUTTON CONFIGURATIONS

BACKGROUND OF THE INVENTION

Technical Field

Aspects of the embodiments relate to wall mounted control devices, and more specifically to an apparatus, system and method for a wall mounted control device with tactile and touch sensing button combination to increase button configurations.

Background Art

The popularity of home and building automation has grown in recent years partially due to increases in affordability, improvements, simplicity, and a higher level of technical sophistication of the average end-user. Automation systems integrate various electrical and mechanical system elements within a building or a space, such as a residential home, commercial building, or individual rooms, including meeting rooms, lecture halls, or the like. Examples of such system elements include heating, ventilation and air conditioning (HVAC), lighting control systems, audio and video (AV) switching and distribution, motorized window treatments (including blinds, shades, drapes, curtains, etc.), occupancy and/or lighting sensors, and/or motorized or hydraulic actuators, and security systems, to name a few.

One way a user can be given control of an automation system, is through the use of one or more control devices, such as keypads. A keypad is typically mounted in a recessed receptacle in a building wall, commonly known as an electrical or a gang box, and comprises one or more buttons or keys each assigned to perform a predetermined or assigned function. Assigned functions may include turning various types of loads on or off, or sending other types of commands to the loads, for example, orchestrating various lighting presets or scenes of a lighting load. The various buttons are typically removable and may be printed with indicia to either identify its respective function or indicate status of the controlled load.

To accomplish varying button configurations, a plurality of tactile switches may be disposed on a printed circuit board (PCB) of the keypad in an array configuration, for example a 3×5 array of fifteen tactile switches. One or a plurality of buttons of varying sizes and button types, such as push buttons, side to side rockers, or up and down rockers, can be disposed over the PCB of the keypad to actuate one or more of the tactile switches. However, such configurations are costly as they require many additional tactile switches and separate types of button caps to enable different button types—e.g., separate button caps for a push button, a side to side rocker button, and an up and down rocker button. This impedes consistency and complicates supply chain. Additionally, multiple button configurations types are difficult to achieve using only tactile switches—such as a side to side rocker that can also be pushed in the center without ever actuating multiple switches. While one solution to this problem is by using a fully capacitive touch sensing solution with haptic feedback, a haptic feedback on a wall mounted device requires floating of the entire assembly for acceptable results for feel and sound. Even with that, it would not provide the appropriate button feel such as provided by a tactile switch.

Accordingly, a need has arisen for an apparatus, system, and method for a wall mounted control device with interchangeable buttons that is accomplished through a combination of tactile switches and touch sensors to increase button configurations.

SUMMARY OF THE INVENTION

It is an object of the embodiments to substantially solve at least the problems and/or disadvantages discussed above, and to provide at least one or more of the advantages described below.

It is therefore a general aspect of the embodiments to provide an apparatus, system, and method for a wall mounted control device with interchangeable buttons that is accomplished through a combination of tactile switches and touch sensors to increase button configurations.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

DISCLOSURE OF INVENTION

According to one aspect of the embodiments, a wall mounted control device is provided comprising a housing assembly, at least one button, and a controller. The housing assembly comprises a front surface including plurality of button zones each comprising a tactile switch and a plurality of touch sensors. The at least one button comprises a projection extending from a rear surface thereof. The at least one button is adapted to attach to the housing assembly over at least one of the button zones such that the projection is aligned with the tactile switch in the at least one of the button zones. The controller, electrically connected to the tactile switches and the touch sensors, determines which button zone and which location of the button zone is actuated in response to receiving signals from at least one of the tactile switches and at least one of the touch sensors.

According to an embodiment, the controller receives and stores programming data comprising a size of each button attached to the housing assembly, a function of each button, and a location of each button in relation to the button zones. The controller may use the programming data to enable or disable one or more of the tactile switches and touch sensors. The controller may use the programming data to assign control commands to a combination of one or more tactile switches and one or more touch sensors. The at least one button may be selected from at least one of a push button, a side to side rocker button, an up and down rocker button, and any combination thereof.

According to an embodiment, the tactile switch provides haptic feedback when the at least one button is pressed. The touch sensors may comprise capacitive touch sensors, inductive touch sensors, infrared touch sensors, surface acoustic wave touch sensors, or any combinations thereof. The controller may determine whether the at least one button is being actuated at a left side, at a right side, at an upper side, at a lower side, or at a center of the at least one button using the plurality of touch sensors. Each button zone may comprise the tactile switch arranged substantially at a center of the button zone and two touch sensors arranged on opposite sides of the tactile switch. Each button zone may further comprise a third touch sensor arranged at the center of the button zone.

According to an embodiment, the at least one button comprises a single height button adapted to cover a single zone of the plurality of button zones, wherein the controller receives programming data comprising a selection of a button zone from the plurality of button zones and a selection of a button type. The controller may use the plurality of touch sensors in the selected button zone to determine whether the single height button is pressed on a left side, on a right side, or on the center of the single height button. When the selected button type comprises a push button, the controller associates a control command with the tactile switch of the selected button zone. When the selected button type comprises a side to side rocker, the controller associates a first control command with one of the touch sensors in the selected button zone proximate to a left side of the single height button and a second control command with another one of the touch sensors in the selected button zone proximate to a right side of the single height button.

According to another embodiment, the at least one button comprises a multi height button adapted to cover two or more of the plurality of button zones, wherein the controller receives programming data comprising a selection of two or more button zones from the plurality of button zones and a selection of a button type. The controller may use the plurality of touch sensors in the selected button zones to determine whether the multi height button is pressed on a left side, a right side, an upper side, or a lower side of the multi height button. When the selected button type comprises a push button, the controller associates a control command with one or more of the tactile switches of the selected button zones. When the selected button type comprises a side to side rocker, the controller associates a first control command with one or more of the touch sensors in the selected button zones proximate to a left side of the multi height button and a second control command with one or more of the touch sensors in the selected button zone proximate to a right side of the multi height button. When the selected button type comprises an up and down rocker, the controller associates a first control command with one or more of the touch sensors in the selected button zones proximate to an upper side of the multi height button and a second control command with one or more of the touch sensors in the selected button zones proximate to a lower side of the multi height button. When the selected button type comprises an up-down and side to side rocker, the controller associates a first control command with one or more of the touch sensors in the selected button zones proximate to a left side of the multi height button, a second control command with one or more of the touch sensors in the selected button zone proximate to a right side of the multi height button, a third control command with one or more of the touch sensors in the selected button zones proximate to an upper side of the multi height button, and a fourth control command with one or more of the touch sensors in the selected button zones proximate to a lower side of the multi height button.

According to yet another embodiment, the plurality of touch sensors comprise a first touch sensor strip longitudinally extending on a left side of the front surface of the housing assembly across the plurality of button zones and a second touch sensor strip longitudinally extending on a right side of the front surface of the housing assembly across the plurality of button zones. The controller may determine which button zone is actuated using the tactile switches and which location the button zone is actuated using the first and second touch sensor strips.

According to another aspect of the embodiments, a wall mounted control device is provided comprising a housing assembly, at least one button, and a controller. The housing assembly comprises a front surface including plurality of button zones each comprising a tactile switch and a plurality of touch sensors. The at least one button comprises a projection extending from a rear surface thereof, wherein the at least one button is adapted to attach to the housing assembly over at least one of the button zones such that the projection is aligned with the tactile switch in the at least one of the button zones. The controller is electrically connected to the tactile switches and the touch sensors, wherein the controller selects a control command in response to receiving a signal from at least one of the tactile switches and a signal from at least one of the touch sensors.

According to a further aspect of the embodiments, a wall mounted control device is provided comprising a housing assembly, at least one button, and a controller. The housing assembly comprises a front surface including plurality of button zones each comprising a tactile switch, wherein the front surface further includes a pair of touch sensors longitudinally extending on opposite sides of the front surface across the plurality of button zones. The at least one button comprises a projection extending from a rear surface thereof, wherein the at least one button is adapted to attach to the housing assembly over at least one of the button zones such that the projection is aligned with the tactile switch in the at least one of the button zones. The controller is electrically connected to the tactile switches and the touch sensors, wherein the controller determines which button zone and which location of the button zone is actuated in response to receiving signals from at least one of the tactile switches and at least one of the pair of touch sensors.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

BRIEF DESCRIPTION OF THE SEVERAL VIEWS OF THE DRAWINGS

Figure 1:
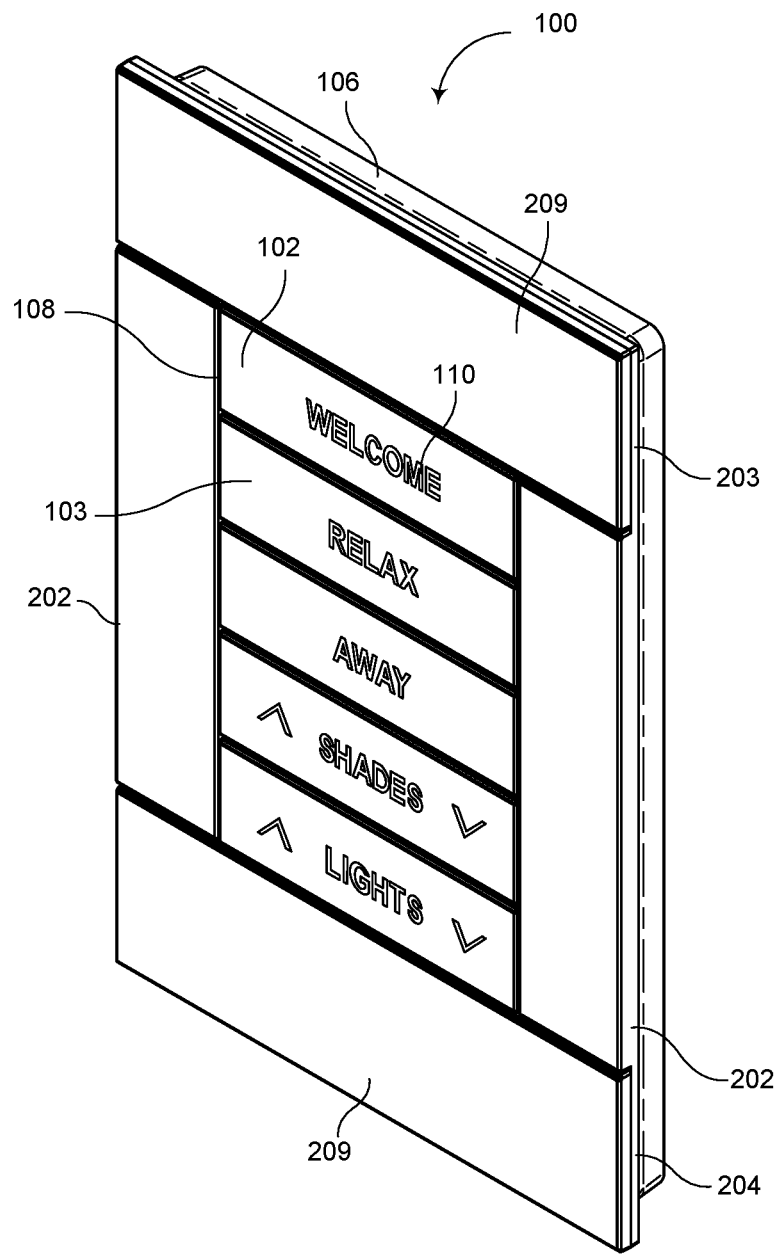

FIG. 1 illustrates a perspective front view of an illustrative wall mounted control device according to an illustrative embodiment.

Figure 2:
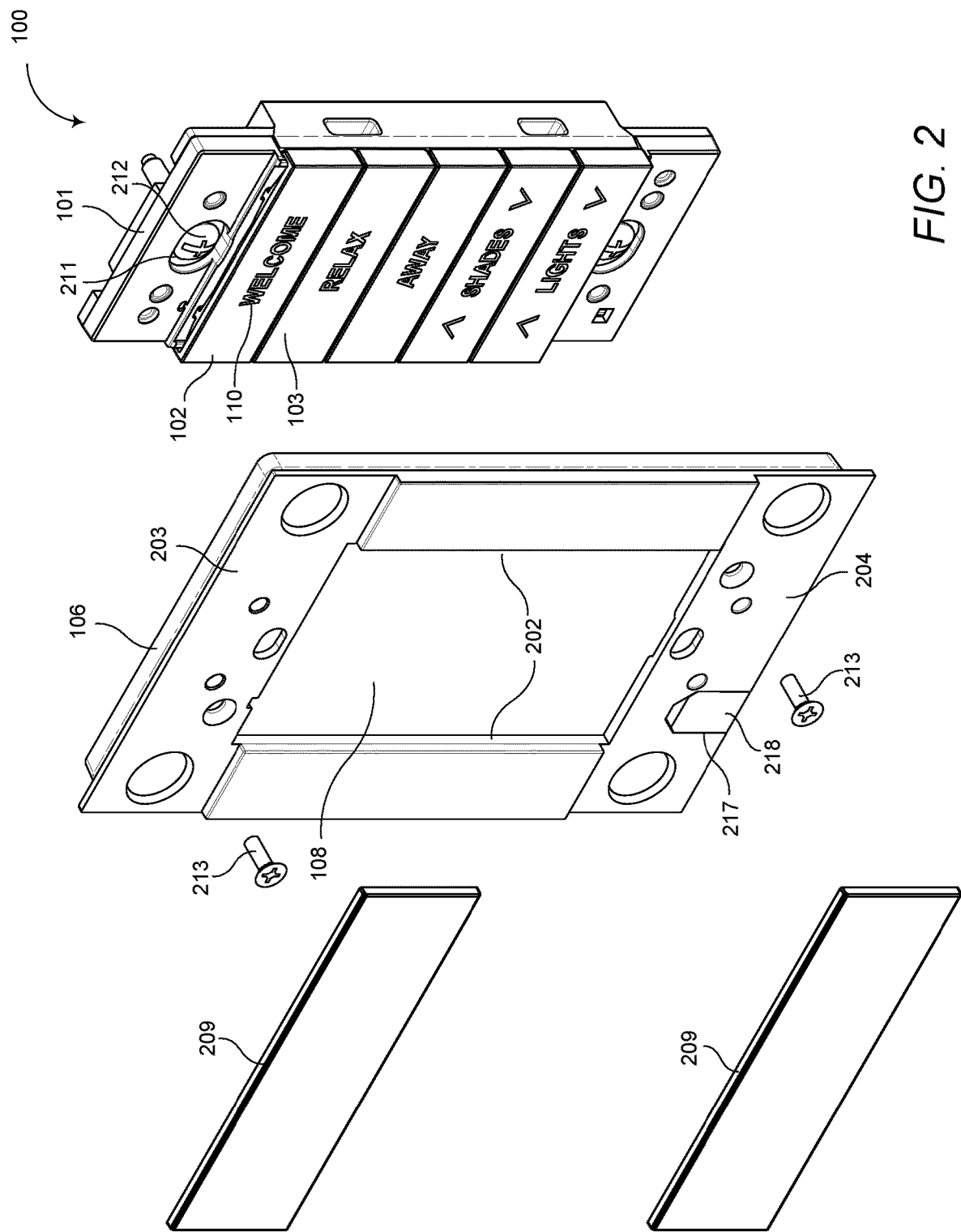

FIG. 2 illustrates a perspective front view of the control device with the faceplate removed according to an illustrative embodiment.

Figure 3:
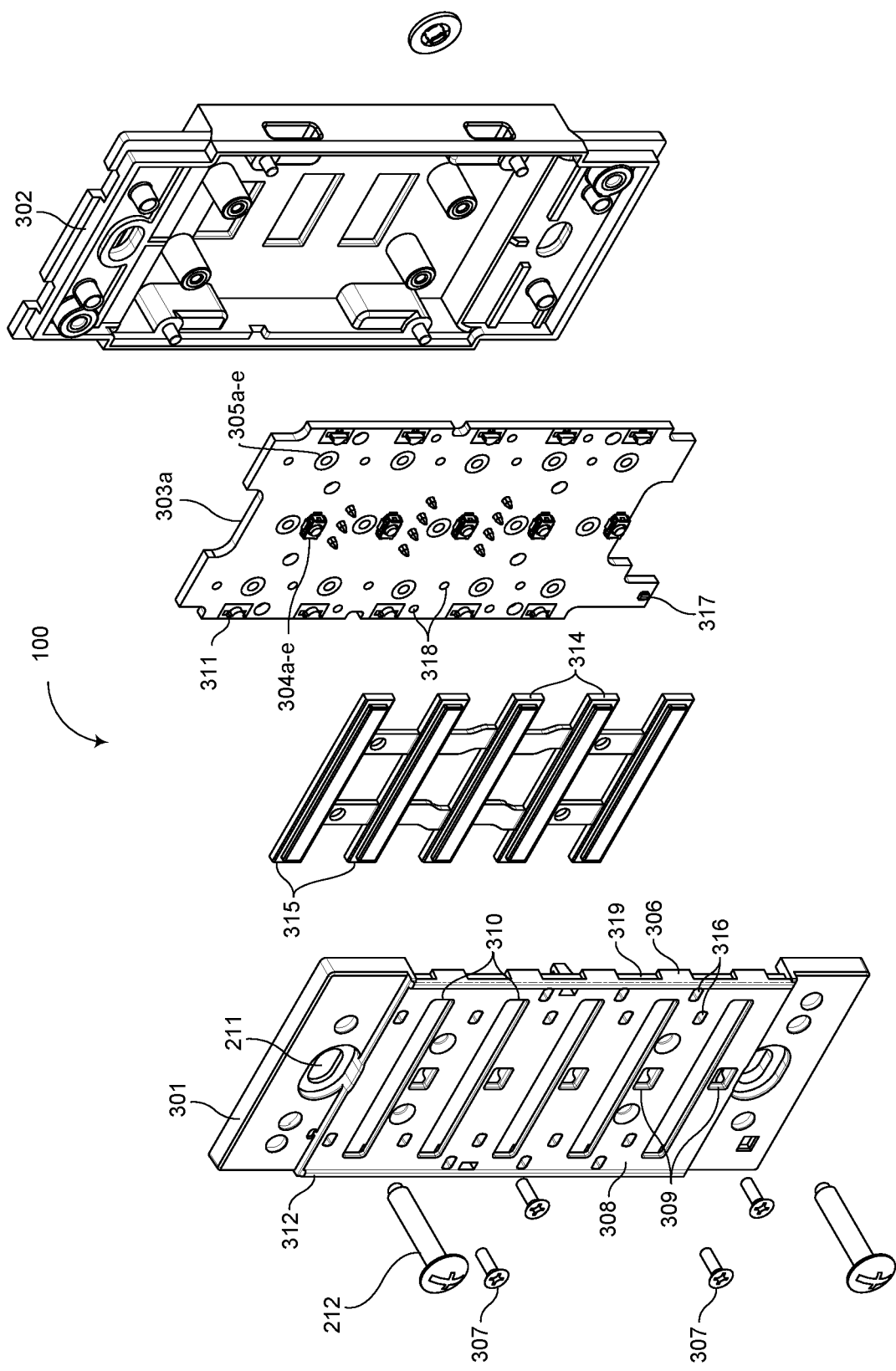

FIG. 3 illustrates an exploded perspective front view of the control device according to an illustrative embodiment.

Figure 4:
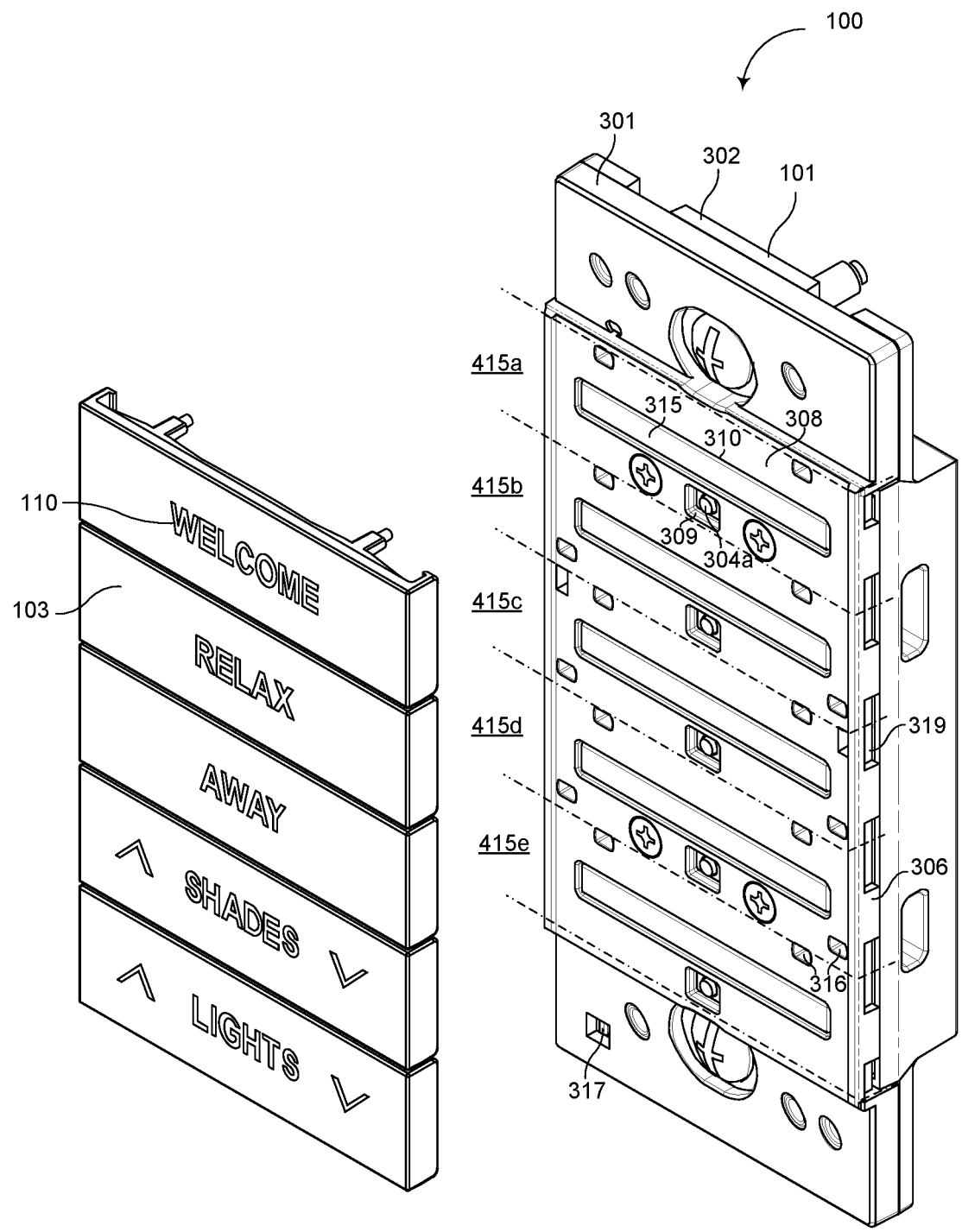

FIG. 4 illustrates a perspective view of the control device with the buttons removed according to an illustrative embodiment.

Figure 5:
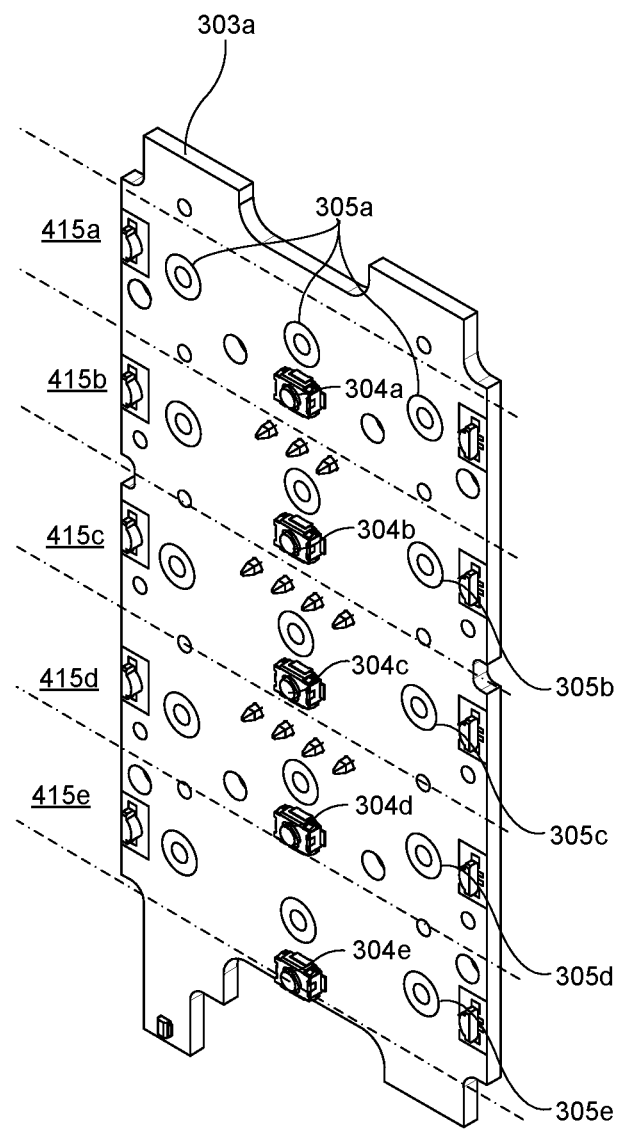

FIG. 5 shows a perspective front view of a printed circuit board of the control device with a combination of tactile switches and touch sensors according to an illustrative embodiment.

Figure 6:
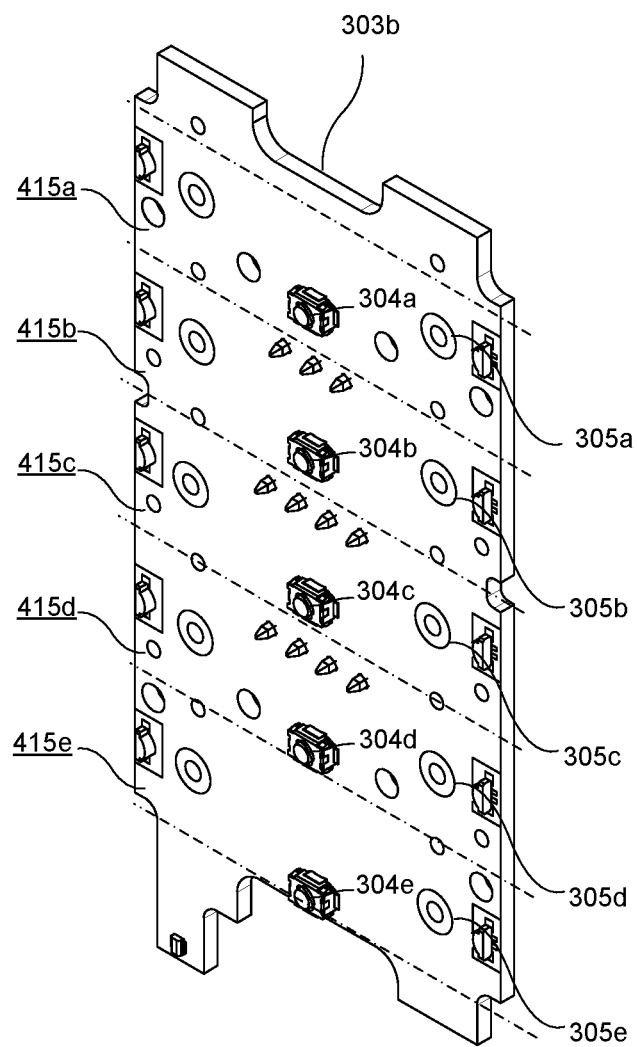

FIG. 6 shows a perspective front view of another embodiment of a printed circuit board of the control device with a combination of tactile switches and touch sensors according to an illustrative embodiment.

Figure 7:
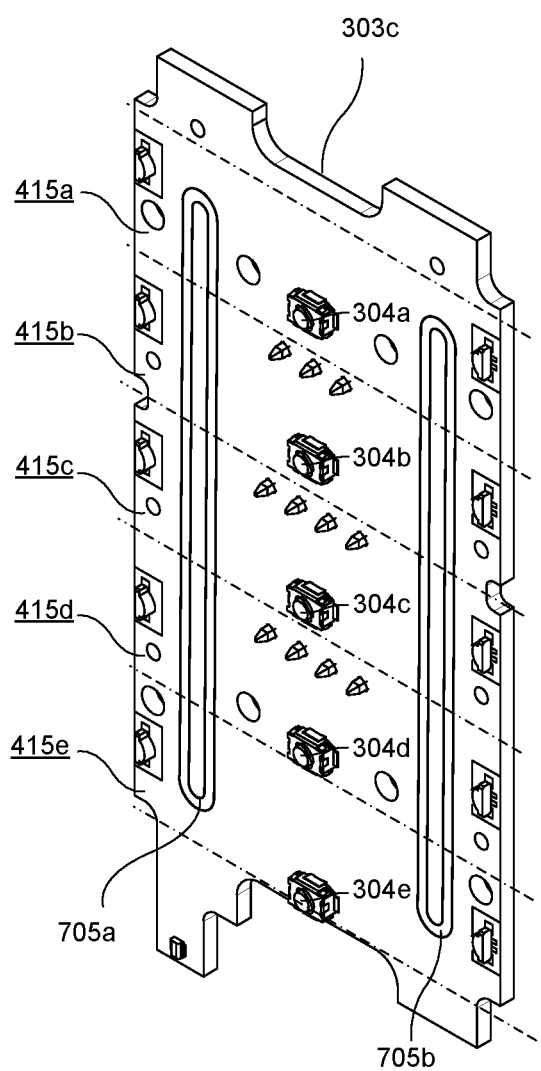

FIG. 7 shows a perspective front view of another embodiment of a printed circuit board of the control device with a combination of tactile switches and touch sensors according to an illustrative embodiment.

FIG. 8A illustrates a front perspective view of a single height button according to an illustrative embodiment.

FIG. 8B illustrates a rear perspective view of the single height button according to an illustrative embodiment.

FIG. 8C illustrates a top view of the single height button according to an illustrative embodiment.

FIG. 8D illustrates a side view of the single height button according to an illustrative embodiment.

Figure 9A:
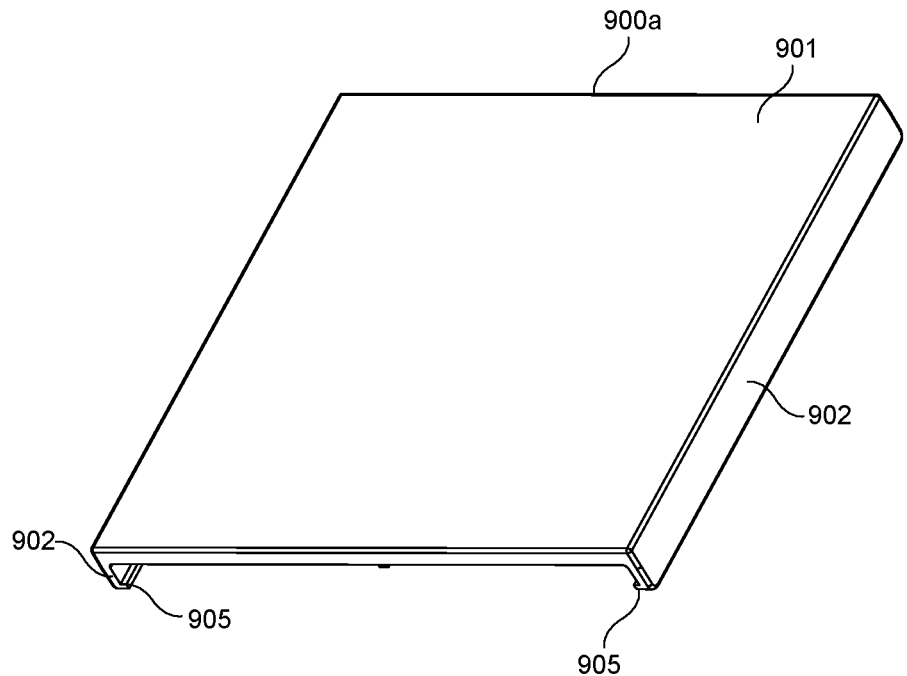

FIG. 9A illustrates a front perspective view of a three height button according to an illustrative embodiment.

Figure 9B:
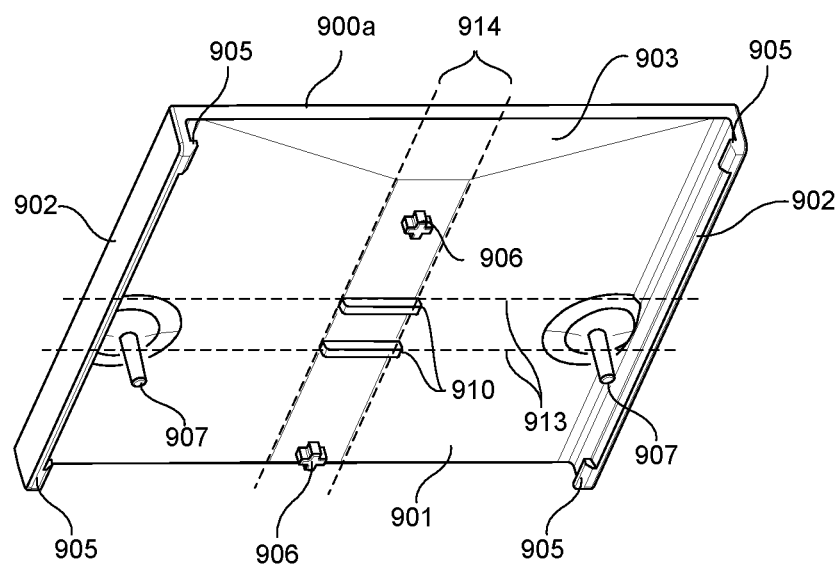

FIG. 9B illustrates a rear perspective view of the three height button according to an illustrative embodiment.

Figure 9C:
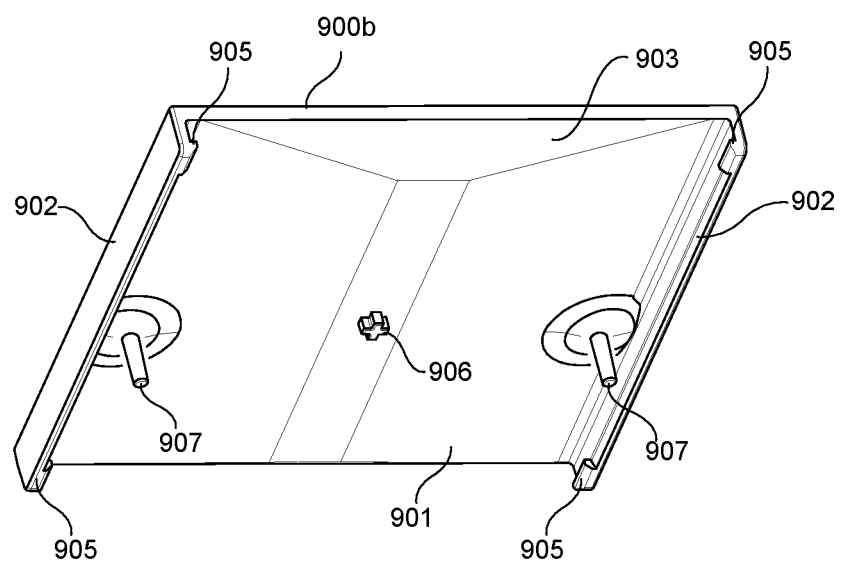

FIG. 9C illustrates a rear perspective view of a three height button according to another illustrative embodiment.

Figure 10:
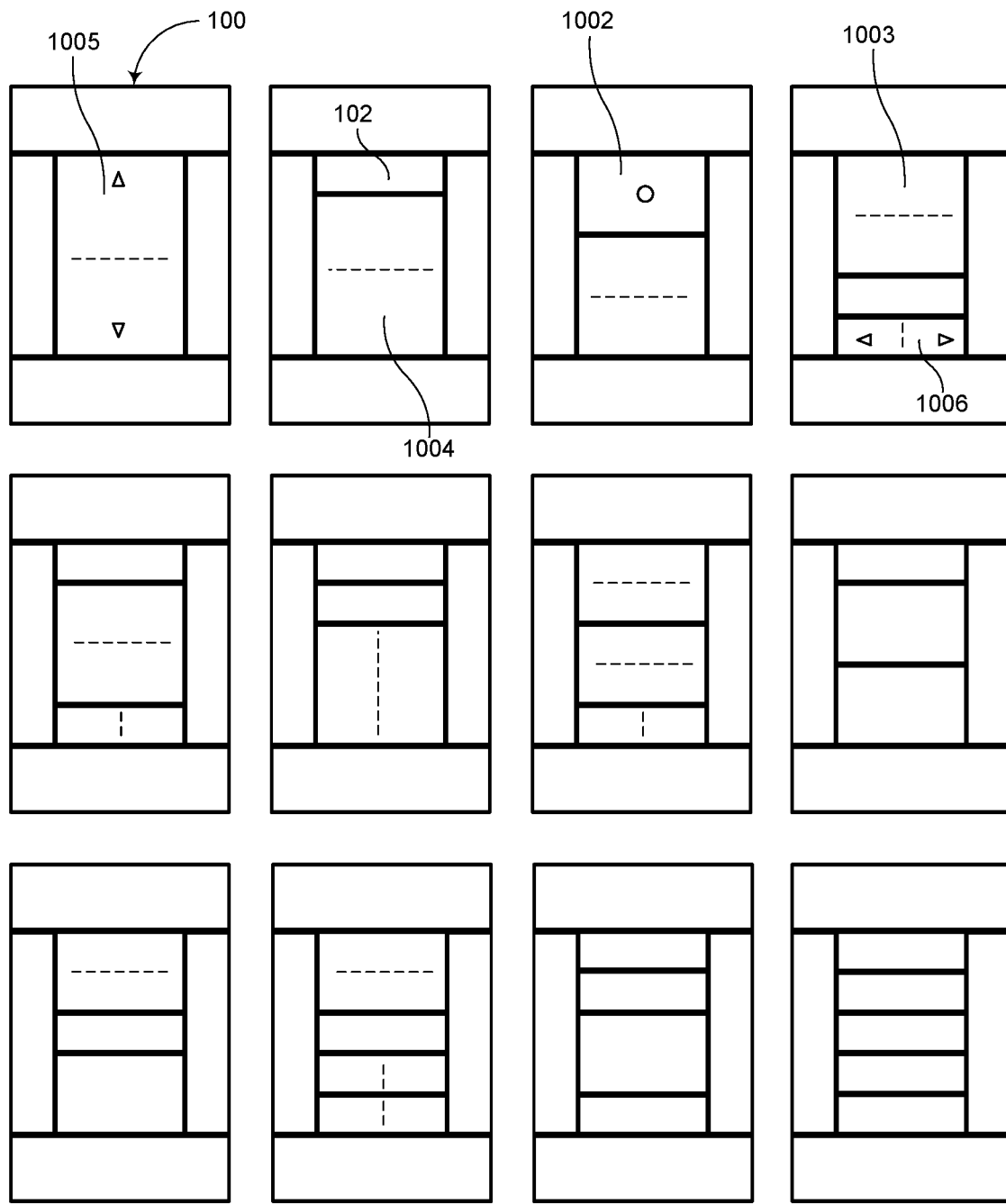

FIG. 10 illustrates various possible button configurations of the control device according to an illustrative embodiment.

Figure 11:
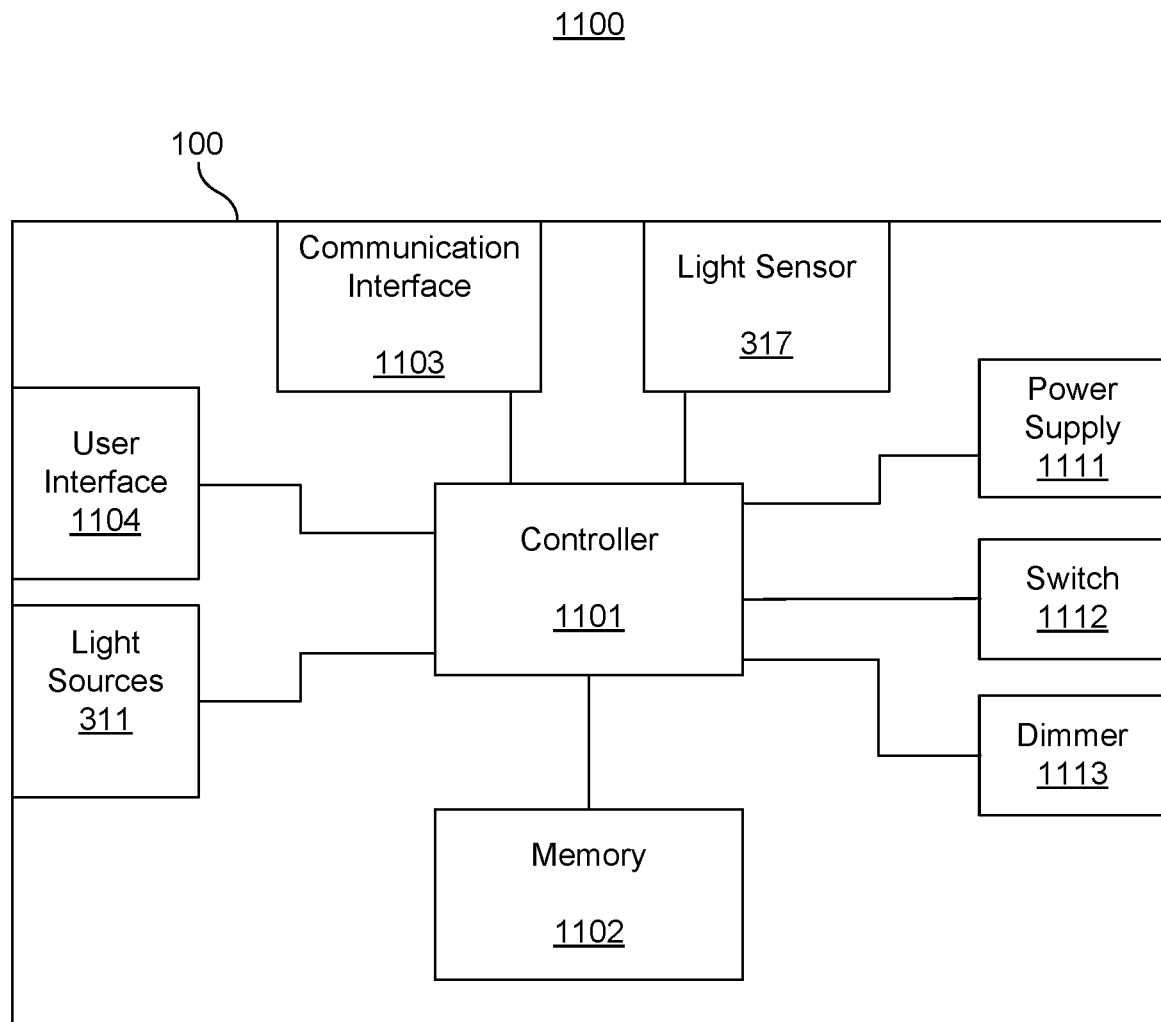

FIG. 11 is an illustrative block diagram of a control device according to an illustrative embodiment.

Figure 12:
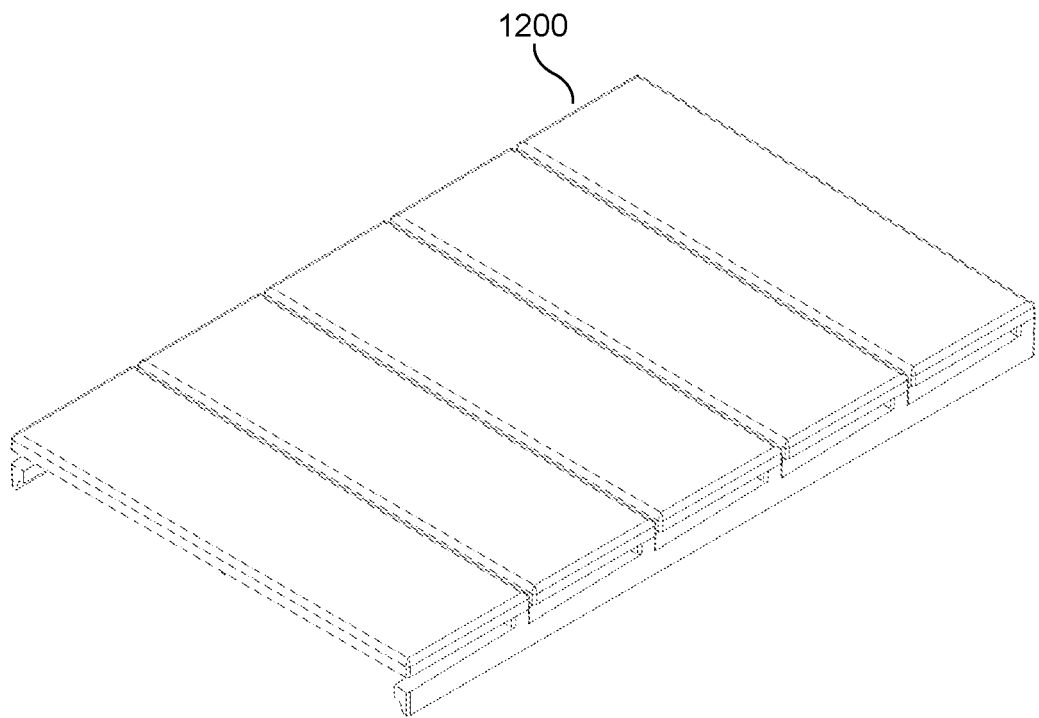

FIG. 12 illustrates a perspective front view of a button tree according to an illustrative embodiment.

DETAILED DESCRIPTION OF THE INVENTION

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
100 Control Device
101 Housing
102 Buttons
103 Front Surface
106 Faceplate
108 Opening
110 Indicia
202 Vertical Side Walls
203 Horizontal Top Wall
204 Horizontal Bottom Wall
209 Trim Plate
211 Mounting Holes
212 Screws
213 Screws
217 Opening
218 Lens
301 Front Housing Portion
302 Rear Housing Portion
303a-c Printed Circuit Board(s) (PCB)
304a-e Tactile Switches
305a-e Touch Sensors
306 Side Walls
307 Screws
308 Front Wall
309 Openings
310 Openings
311 Light Sources/Light Emitting Diodes (LEDs)
314 Side Edges
315 Light Bars
316 Orifices
317 Light Sensor
318 Orifices
319 Shoulders
415a-e Button Zones
705a Left Touch Sensor
705b Right Touch Sensor
801 Front Wall
802 Side Walls
803 Rear Surface
805 Arms
806 Projection
807 Posts
810 Abutments
813 Horizontal Pivot Axis
814 Vertical Pivot Axis
900a-b Three-zone Height Button(s)
901 Front Wall
902 Side Walls
903 Rear Surface
905 Arms
906 Projections
907 Posts
910 Abutment
913 Horizontal Pivot Axes
914 Vertical Pivot Axes
1002 Two-zone Height Button
1003 Three-zone Height Button
1004 Four-zone Height Button 1005 Five Height Button
1100 Block Diagram of a Control Device
1101 Controller
1102 Memory
1103 Communication Interface
1104 User Interface
1111 Power Supply
1112 Switch
1113 Dimmer
1200 Button Tree

LIST OF ACRONYMS USED IN THE
SPECIFICATION IN ALPHABETICAL ORDER

The following is a list of the acronyms used in the specification in alphabetical order.
AC Alternating Current
ASIC Application Specific Integrated Circuit
AV Audiovisual
DC Direct Current
HVAC Heating, Ventilation and Air Conditioning
IR Infrared
LED Light Emitting Diode
PCB Printed Circuit Board
PoE Power-over-Ethernet
RAM Random-Access Memory
RF Radio Frequency
RGB Red-Green-Blue
RISC Reduced Instruction Set Computer
ROM Read-Only Memory

MODE(S) FOR CARRYING OUT THE
INVENTION

For 40 years Crestron Electronics, Inc. has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein can be manufactured by Crestron Electronics, Inc., located in Rockleigh, N.J.

The different aspects of the embodiments described herein pertain to the context of wall mounted control devices, but are not limited thereto, except as may be set forth expressly in the appended claims. Particularly, the aspects of the embodiments are related to an apparatus, system, and method for a wall mounted control device with interchangeable buttons or button trees that are accomplished through a combination of tactile switches and touch sensors to increase button configurations. This allows the control device to accommodate various button configurations, such as those shown in FIG. 10, without the need for a large number of tactile switches. Also, the present embodiments obviate the need for multiple button designs to accomplish different functions, such as a push button, a side to side rocker button, or an up and down rocker button. The benefit is compounded further when using fixed button tree assemblies, obviating the need for large quantities of configurations of different button types. The present combination of tactile switches with touch sensors allows for a single button design or button tree design that accommodates various functions through programming and engraving, including but not limited to a push button function, a side to side rocker function, an up-down rocker function, or any combinations thereof, such as a side to side rocker with center push function or an up-down rocker with center push function. As such, the number of button types or button trees required is reduced while the number of allowable configurations is increased.

Referring to FIG. 1, there is shown a perspective front view of an illustrative wall mounted control device 100 according to an illustrative embodiment. The control device 100 may serve as a user interface to associated loads or load controllers in a space. According to an embodiment, the control device 100 may be configured as a keypad comprising a plurality of buttons, such as five single height buttons 102. However, other button configuration may be used as will be described below. For example, the control device 100 may be configured as a lighting switch having a single button that may be used to control an on/off status of the load. Alternatively, or in addition, the single button can be used to control a dimming setting of the load. Each button 102 may be associated with a particular load and/or to a particular operation of a load, such as different lighting scenes.

In an illustrative embodiment, the control device 100 may be configured to receive control commands directly from a user via buttons 102, and either directly or through a control processor transmit the control command to a load (such as a light, fan, window blinds, etc.) or to a load controller (not shown) electrically connected to the load to control an operation of the load based on the control commands. In various aspects of the embodiments, the control device 100 may control various types of electronic devices or loads. The control device 100 may comprise one or more control ports for interfacing with various types of electronic devices or loads, including, but not limited to audiovisual (AV) equipment, lighting, shades, screens, computers, laptops, heating, ventilation and air conditioning (HVAC), security, appliances, and other room devices. The control device 100 may be used in residential load control, or in commercial settings, such as classrooms or meeting rooms.

Each button 102 may comprise indicia 110 disposed thereon to provide designation of each button's function. Each button 102 may be backlit, for example via light emitting diodes (LEDs), for visibility and/or to provide status indication of the button 102. For example, buttons 102 may be backlit by white, blue, or another color LEDs. Different buttons 102 may be backlit via different colors to distinguish between buttons, load types (e.g., emergency load), or the load state (e.g., on, off, or selected scene), AV state (e.g., selected station or selected channel), or button backlight colors may be chosen to complement the surroundings or to give a pleasing visual effect. Buttons 102 may comprise opaque material while the indicia 110 may be transparent or translucent allowing light from the LEDs to pass through the indicia 110 and be perceived from the front surface 103 of the button 102. The indicia 110 may be formed by engraving, tinting, printing, applying a film, etching, and/or similar processes.

Reference is now made to FIGS. 1 and 2, where FIG. 2 shows the control device 100 with the faceplate 106 removed. The control device 100 may comprise a housing 101 adapted to house various electrical components of the control device 100, such as the power supply and an electrical printed circuit board (PCB) 303a (FIG. 3). The housing 101 is further adapted to carry the buttons 102 thereon. The buttons 102 may be removably attached to the sides of the housing 101 such that they appear to float on the housing 101. Although in other embodiments, the buttons 102 may not be removable or replaceable. Other button design and attachment (e.g., non-floating buttons) may also be used with the current embodiments. The housing 101 may comprise mounting holes 211 for mounting the control device 100 to a standard electrical box via screws 212. According to another embodiment, control device 100 may be mounted to other surfaces using a dedicated enclosure. According yet to another embodiment, the control device 100 may be configured to sit freestanding on a surface, such as a table, via a table top enclosure.

Once mounted to a wall or an enclosure, the housing 101 may be covered using a faceplate 106. The faceplate 106 may comprise an opening 108 sized and shaped for receiving the buttons 102 and/or at least a front portion of the housing 101 therein. The faceplate 106 may be secured to the housing 101 using screws 213. According to an embodiment, the faceplate 106 may comprise a pair of vertical side walls 202 interconnected at their top by a horizontal top wall 203 and at their bottom by a horizontal bottom wall 204. Horizontal top and bottom walls 203 and 204 are each adapted to receive a decorative trim plate 209 thereon that covers the screws 213. The trim plates 209 may be removably attached to the top and bottom horizontal walls 203 and 204 using magnets (not shown). However, other types of faceplates may be used. A plurality of control devices 100 may also be ganged next to each other and covered using a multi gang faceplate as is known in the art.

Referring now to FIG. 3, which illustrates an exploded view of the control device 100. Housing 101 of control device 100 may comprise a front housing portion 301 and a rear housing portion 302 adapted to fit within a standard electrical or junction box. Housing 101 contains various electrical components, for example disposed on a printed circuit board (PCB) 303a or a plurality of PCBs, configured for providing various functionality to the control device 100, including for receiving commands and transmitting commands wirelessly to a load or a load controlling device. FIG. 11 is an illustrative block diagram 1100 of the electrical components of the control device 100. Control device 100 may comprise a power supply 1111 that may be housed in the rear housing portion 302 for providing power to the various circuit components of the control device 100. The control device 100 may be powered by an electric alternating current (AC) power signal from an AC mains power source or via DC voltage. Such control device 100 may comprise leads or terminals suitable for making line voltage connections. In yet another embodiment, the control device 100 may be powered using Power-over-Ethernet (PoE) or via a Cresnet® port. Cresnet® provides a network wiring solution for Creston® keypads, lighting controls, thermostats, and other devices. The Cresnet® bus offers wiring and configuration, carrying bidirectional communication and 24 VDC power to each device over a simple 4-conductor cable. However, other types of connections or ports may be utilized.

The control device 100 may further include a controller 1101 comprising one or more microprocessors, such as "general purpose" microprocessors, a combination of general and special purpose microprocessors, or application specific integrated circuits (ASICs). Additionally, or alternatively, the controller 1101 can include one or more reduced instruction set computer (RISC) processors, video processors, or related chip sets. The controller 1101 can provide processing capability to execute an operating system, run various applications, and/or provide processing for one or more of the techniques and functions described herein. The control device 100 can further include a memory 1102 communicably coupled to the controller 1101 and storing data and executable code. The memory 1102 can represent volatile memory such as random-access memory (RAM), but can also include nonvolatile memory, such as read-only memory (ROM) or Flash memory. In buffering or caching data related to operations of the controller 1101, memory 1102 can store data associated with applications running on the controller 1101.

The control device 100 can further comprise one or more communication interfaces 1103, such as a wired or a wireless communication interface, configured for transmitting control commands to various connected loads or electrical devices, and receiving feedback. A wireless interface may be configured for bidirectional wireless communication with other electronic devices over a wireless network. In various embodiments, the wireless interface can comprise a radio frequency (RF) transceiver, an infrared (IR) transceiver, or other communication technologies known to those skilled in the art. In one embodiment, the wireless interface communicates using the infiNET EX® protocol from Crestron Electronics, Inc. of Rockleigh, N.J. infiNET EX® is an extremely reliable and affordable protocol that employs steadfast two-way RF communications throughout a residential or commercial structure without the need for physical control wiring. In another embodiment, communication is employed using the ZigBee® protocol from ZigBee Alliance. In yet another embodiment, the wireless communication interface may communicate via Bluetooth transmission. A wired communication interface may be configured for bidirectional communication with other devices over a wired network. The wired interface can represent, for example, an Ethernet or a Cresnet® port. In various aspects of the embodiments, control device 100 can both receive the electric power signal and output control commands through the PoE interface.

The control device 100 may further comprise a user interface 1104. As shown in FIG. 3, the front surface of the PCB 303a may comprise a plurality of micro-switches or tactile switches 304a-e and a plurality of touch sensors 305a-e. For example, the PCB 303a may contain a single column of five tactile switches 304a-e and fifteen touch sensors 305a-e arranged in a three columns and five rows to accommodate various number of button configurations. However, other number of switches and touch sensors and their respective layouts may be utilized to accommodate other button configurations. The tactile switches 304a-e and touch sensors 305a-e are adapted to be activated via buttons 102 to receive user input as further discussed below.

Referring back to FIG. 11, the control device 100 may also comprise a switch 1112 configured for switching a connected load on or off in response to an actuation of a button 102. According to one embodiment, switch 1112 may comprise of one or more electromechanical relays, which may use an electromagnet to mechanically operate a switch. In another embodiment, a solid-state relay (SSR) may be used comprising semiconductor devices, such as thyristors (e.g., TRIAC) and transistors, to switch currents up or down. In addition, the control device 100 may comprise of one or more dimmers 1113 configured for providing a dimmed voltage output to a connected load, such as a lighting load, in response to user input. The dimmer 1113 may comprise a solid-state dimmer for dimming different types of lighting loads, including incandescent, fluorescent, LED, or the like. According to an embodiment, the dimmer 1113 may comprise a 0-10V DC dimmer to provide a dimmed voltage output to an LED lighting load, a fluorescent lighting load, or the like. The dimmer 1113 of the control device 100 may also reduce its output based on light levels reported by the light sensor 317.

The control device 100 may further comprise a plurality of light sources 311 configured for providing backlighting to corresponding buttons 102. Each light source 311 may comprise a multicolored light emitting diode (LED), such as a red-green-blue LED (RGB LED), comprising of red, green, and blue LED emitters in a single package. Although a white LED emitter or LED emitters of other colors can be used instead or additionally included. Each red, green, and blue LED emitter can be independently controlled at a different intensity to selectively produce a plurality of different colors. The plurality of LEDs 311 may be powered using one or more LED drivers located on PCB 303a. According to an embodiment, a pair of LEDs 311 may be located on two opposite sides of each row of tactile switches 304a-e.

The control device 100 may further comprise a light sensor 317 configured for detecting and measuring ambient light. According to an embodiment, light sensor 317 can comprise at least one photosensor having an internal photocell with 0-65535 lux (0-6089 foot-candles) light sensing output to measure light intensity from natural daylight and ambient light sources. Light sensor 317 may be used to control the intensity of the load that is being controlled by the control device 100. In addition, light sensor 317 may be used to control the intensity levels of LEDs 311 based on the measured ambient light levels. According to an embodiment, light sensor 317 may impact the intensity levels of LEDs 311 to stay at the same perceived brightness with respect to the measured ambient light levels. A dimming curve may be used to adjust the brightness of LEDs 311 based on measured ambient light levels by the light sensor 317. According to another embodiment, ambient light sensor threshold values may be used to adjust the LED intensity or behavior. According to yet another embodiment, light sensor 317 may impact the color of the LEDs 311 based on the measured ambient light levels. Referring to FIG. 2, the faceplate 106 may comprise an opening 217 adapted to contain a lens 218. Lens 218 may direct ambient light from a bottom edge of the faceplate 106 toward the light sensor 317. The lens 218 may be hidden from view by the trim plate 209. The PCB 303a may comprise other types of sensors, such as motion or proximity sensors.

Referring back to FIG. 3, the control device 100 may further comprise a plurality of horizontally disposed rectangular light pipes or light bars 315 each adapted to be positioned adjacent a respective row of tactile switches 304a-e and touch sensors 305a-e and between a respective pair of light sources 311. According to one embodiment, the light bars 315 may be individually attached to the front surface of the PCB 303a, for example, using an adhesive. According to another embodiment, the light bars 315 may be interconnected into a single tree structure and adapted to be attached within the housing 101 via screws 307. Light bars 315 may be fabricated from optical fiber or transparent plastic material such as acrylic, polycarbonate, or the like. Each pair of oppositely disposed light sources 311 may extend from the front surface of the PCB 303a to direct light to opposite side edges 314 of a respective light bar 315. Each light bar 315 in turn will distribute and diffuse light from the respective pair of light sources 311 and direct the light through the indicia 110 of the respective button 102.

The front housing portion 301 is adapted to be secured to the rear housing portion 302 using screws 307 such that the PCB 303a and light bars 315 are disposed therebetween. The front housing portion 301 comprises a front wall 308 with a substantially flat front surface. The front wall 308 may comprise a plurality of openings 309 extending traversely therethrough aligned with and adapted to provide access to the tactile switches 304a-e as shown in FIG. 4. Front wall 308 may further comprise rectangular horizontal openings 310 extending traversely therethrough that are aligned with and sized to surround at least a front portion of a respective light bar 315. The front housing portion 301 may comprise an opaque material, such as a black colored plastic or the like, that impedes light transmission through the front wall 308 to prevent light bleeding from one set of light bar 315 and corresponding light sources 311 to another set. In addition, the front wall 308 may further comprise a plurality of orifices 316, and the PCB 303a may also comprise a plurality of orifices 318 at corresponding locations, for providing alignment points for the buttons 102 as described below.

The front housing portion 301 may comprise a pair of side walls 306 orthogonally and rearwardly extending from side edges of the front wall 308. Each side wall 306 may comprise one or a plurality of recessed shoulders 319 for buttons to clip to. For example, to accommodate five buttons, six recessed shoulders 319 may be provided.

Referring to FIGS. 4 and 5, there is shown a perspective view of the control device 100 with the buttons 102 removed and the PCB 303a, respectively. The control device 100 defines a plurality of button zones 415a-e adapted to receive a plurality of rows of different height buttons. Particularly, each button zone 415a-e may be configured to receive a single height button 102. For example, the control device 100 is shown containing five button zones 415a-e adapted to receive five single height buttons, but it may comprise any other number of button zones. Each button zone 415a-e may comprise one or more tactile switches 304a-e and one or more touch sensors 305a-e, and optionally, one or more button alignment orifices 316, a light bar 315, and one or more corresponding light sources 311.

According to an embodiment, as shown in FIG. 5, each button zone 415a-e may comprise a single tactile switch 304a-e, although additional tactile switches per button zone may be utilized. Tactile switches 304a-e are mechanical switches that provide tactile or haptic feedback via mechanical components by which the user can feel and perceive that a key press has been registered. The feedback may be provided via a spring, a metal snap dome, a rubber dome, a membrane, a leaf spring, a tactile actuator, or other mechanical mechanism known in the art. For example, for a five button zone 415a-e configuration, the PCB 303a may comprise five tactile switches 304a-e arranged in a single column, although a different arrangement can also be used. As such, each button 102, no matter of the size or type, is still provided with at least one tactile switch 304a-e to provide tactile feedback.

Each button zone 415a-e is further associated with an array of a plurality of touch sensors 305a-e. Each touch sensor 305a-e may comprise a capacitive touch sensor comprising at least one conductor pad, such as a copper pad, disposed on the PCB 303a and connected to capacitive sensing controller, which may be separate from or integrated into controller 1101. The conductor pad acts as a capacitor plate that is exposed to an increase in capacitance when a finger comes near or in contact with the pad. The capacitive sensing controller measures changes in the capacitance compared to the environment to detect presence of a finger on or near the conductive pad. Each capacitive touch sensor 305*a-e* can be used to detect a touch of a user's finger through an overlay, in this case the front wall 801 (FIG. 8) of the button 102 when it is attached to the control device 101. According to other embodiments, touch sensors 305*a-e* may comprise other touch sensing technologies known in the art, such as but not limited to inductive touch sensors, infrared touch sensors, surface acoustic wave touch sensors, or the like. The array of touch sensors 305*a-e* in each button zone 415*a-e* may detect the location where a person is pushing the button, e.g., whether a person is pushing the left, right, and/or center part of the button. This can be accomplished with as many as three touch sensing points (e.g., FIG. 5) or as few as two (e.g., FIG. 6) per zone, although other number of touch sensors may be utilized per zone. FIG. 5 illustrates three touch sensors 305*a-e* arranged in a row per each button zone 415*a-e*, respectively, resulting in fifteen touch sensing points. Each center touch sensor in the array 305*a-e* may be in proximity to the respective tactile switch 304*a-e* in the respective button zone 415*a-e*. The other two touch sensors in the array 305*a-e* may be arranged on two opposite sides of the respective tactile switch 304*a-e* in each button zone 415*a-e*. As such, each button zone 415*a-e* comprises a group of three touch sensing points—for center, left, and right detection.

Referring to FIG. 10, different button configurations can be implemented by combining different height buttons. In addition to a single height button that spans a single button zone (e.g., 102), two or more button zones 415*a-e* may be combined to receive a multi-zone height button, such as a two-zone height button that spans two button zones (e.g., 1002), a three-zone height button that spans three button zones (e.g., 1003), a four-zone height button that spans four button zones (e.g., 1004), or a five-zone height button that spans five button zones (e.g., 1005). The various button configurations beneficially share the same circuit board layout shown in FIG. 5 by utilizing one or more of the tactile switches 304*a-e* and touch sensors 305*a-e*. Depending on which tactile switches 304*a-e* and touch sensors 305*a-e* are exposed by a button, each of the various single or multi-zone button height buttons may be configured to operate as a push button (e.g., button 1002), a side to side rocker button with or without a center push (e.g., button 1006), an up and down rocker button with or without a center push (e.g., button 1005), or other types of buttons, as further discussed below. As such, the control device 100 of the present embodiments may interchangeably receive various single or multi-zone height buttons to provide a vast number of possible configurations and operations, as required by an application, some of which are shown in FIG. 10. Other button assembly configurations are also contemplated by the present embodiments.

The wall-mounted control device 100 can be configured in the field, such as by an installation technician, in order to accommodate many site-specific requirements. Field configuration can include selection and installation of an appropriate button configuration, and assignment of button functions, based on the type of load, the available settings for the load, etc. Advantageously, such field configurability allows an installation technician to adapt the electrical device to changing field requirements (or design specifications). The buttons can be field replaceable without removing the device from the wall. After securing the buttons 102 on the control device 100, the installer may program the button configuration through a setup application or by tapping on the installed buttons through a setup sequence. The configured buttons can then be assigned to a particular load or a load function.

Referring to FIGS. 8A-8D, there is shown an exemplary single press single height button 102, where FIG. 8A shows a front perspective view of the single height button 102, FIG. 8B shows a rear perspective view of the single height button 102, FIG. 8C shows a top view of the single height button 102, and FIG. 8D shows a side view of the single height button 102. Button 102 may comprise a front wall 801 comprising the front surface 103 and a rear surface 803. A pair of side walls 802 may laterally and rearwardly extend from the side edges of the front wall 801. Each side wall 802 may comprise a pair of arms 805 transversely and inwardly extending from a terminal end of the side wall 802. The button 102 may further comprise a pair of alignment posts 807 transversely extending from the rear surface 803 of the front wall 801. The posts 807 may be received in orifice 316 in the front wall 308 of the front housing portion 301 and in orifice 318 in the PCB 303*a* to align the button 102 with the housing 101. In addition, the button 102 may comprise one or more abutments 810 transversely extending from its rear surface 803 to provide one or more pivot points or axes, such as a horizontal pivot axis 813, and one or two vertical pivot axes 814. Although other button designs are contemplated where posts 807 and/or abutments 810 are not included. The button 102 may also comprise a switch actuator in the form of a projection or a hammer 806 transversely extending from the horizontal center of the rear surface 803 of the button 102. The projection 806 is adapted to depress or strike at least one tactile switch 304*a-e* located on the PCB 303*a* when the button 102 is pressed by a user.

Referring to FIGS. 4-5, and 8A-8D, the single-zone height button 102 comprises a height substantially equal to a height of a single button zone (e.g., 415*a*) such that it may be attached to the front housing portion 301 at any one of the button zones 415*a-e*. For example, the single-zone height button 102 may be attached to the front housing portion 301 at zone 415*a* by being snapped onto the front housing portion 301. Particularly, each pair of arms 805 on each side wall 802 of button 102 are caused to engage a pair of adjacent shoulders 319 in a respective side wall 306 of the front housing portion 301 aligned with zone 415*a*, such that the button 102 hugs side walls 306 of the front housing portion 301, as shown in FIG. 2. Although the button 102 may be attached to the housing 101 in a different manner. The pair of posts 807 are inserted through the pair of alignment orifices 316 of front housing portion 301 and into respective alignment orifices 318 on the PCB 303*a* at zone 415*a*. This prevents vertical and horizontal displacement of the button 102 out of the zone 415*a*. Abutments 810 may abut against the front housing portion 301 to provide pivoting points or axes. The switch actuating projection 806 will rest against the tactile switch 304*a* without depressing it.

A single-zone height button 102 will expose switch 304*a* and the array of touch sensors 305*a* in zone 415*a*. The location of where the button 102 is pressed, such as center, left side, or right side, can be determined via one of the touch sensors 305*a* located underneath the button 102. Button 102 can be programmed as a push button or a side to side rocker button with or without center push. When programmed as a push button, the tactile switch 304*a* may be activated while touch sensors 305*a* in button zone 415*a* may be deactivated. According to another embodiment, the center touch sensor in array 305*a* may be activated to detect whether the button 102 is pressed in its center. In use, the button 102 may be depressed by a user at proximity to its center, for example to provide an on/off operation, causing the button 102 to pivot about pivot axis 813 in a downward direction and the projection 806 to depress the tactile switch 304a of zone 415a. In response, the controller 1101 detecting a press of switch 304a, and/or proximity of the user's finger to center touch sensor 305a, may execute an assigned command.

Button 102 can also be programmed as a side to side rocker with or without center push, for example to provide a shade raise or lower operation with an optional center push to toggle the shade to fully open or close. When programmed as a side to side rocker, the controller 1101 may activated tactile switch 304a and either all of the touch sensors 305a or two of the touch sensors 305s located on two opposite sides of the tactile switch 304a. In use, the button 102 may be pressed by the user and the controller 1101 detects whether the button 102 is pressed in its center, on its left side, or on its right side—depending on the proximity of the user's fingers to the touch sensors 305a in zone 415a. If the button 102 is pressed on the center, the controller 1101 may ignore the press or execute a command associated with the center press, if any. If the button 102 is pressed on its left side, the projection 806 will depress the tactile switch 304a of zone 415a giving the user the tactile feedback and the button 102 will pivot left with respect to the vertical axis 814. Similarly, if the button 102 is pressed on its right side, the projection 806 will depress the tactile switch 304a of zone 415a giving the user the tactile feedback and the button 102 will pivot right with respect to the vertical axis 814. The controller 1101 will detect whether the button 102 was pressed on its left or right side using the respective touch sensor 305a and will execute assigned command associated with that input.

Referring to FIGS. 9A and 9B, there is shown an exemplary multi-zone height button, for example a three-zone height button 900a, where FIG. 9A shows a front perspective view of button 900a and FIG. 9B shows a rear perspective view of button 900a. Button 900a may comprise a similar configuration as button 102 comprising a front wall 901, side walls 902, arms 905, as well as a pair of alignment posts 907 and abutments 910 extending from its rear surface 903. Button 900a may further comprise a pair of switch actuators in the form of projections or hammers 906 transversely extending from the rear surface 903 of the front wall 901 along its horizontal center. A first projection 906 may be adjacent the top edge of the front wall 901 and a second projection 906 may be adjacent the bottom edge of the front wall 901. Although according to another embodiment, a single projection 906 may be implemented in multi-zone height buttons at a location adapted to engage one of the tactile switches 304a-e as further discussed below.

Referring to FIGS. 4-5 and 9A-9B, the three-zone height button 900a may be attached to the front housing portion 301 over any combination of three adjacent button zones 415a-e. For example, the three-zone height button 900a may be attached to the front housing portion 301 over zones 415c, 415d, and 415e by being snapped onto the front housing portion 301 by engaging arms 905 with shoulders 319 of the front housing portion 301 while abutments 910 abut against the front wall 308 of the front housing portion 301. The three-zone height button 900a with two switch actuating projections 906 will expose two tactile switches 304c and 304e and arrays 305c, 305d, and 305e of nine touch sensors in zones 415c-e, although additional projections 906 may be provided to expose the third tactile switch 304d. Button 900a may be programmed as a push button, a side to side rocker, an up and down rocker, or any combinations thereof, such as a side to side rocker with or without a center push, an up and down rocker with or without a center push, or an up-down and side to side rocker with or without a center push. The location of where the button 900a is pressed, such as center, top side, bottom side, left side, or right side, can be determined via one of the touch sensors 305c-e located underneath button 900a. As such, a separate button cap for each button type is not necessary to achieve different button types. Instead, the same button cap can be used for each button type while the keypad can be programmed to the desired button type and the desired function. The installer may provide input or programming data to the controller 1101 comprising the installed button size, the installed button zone location 415a-e, the desired function for the button, or the like. In response, the controller 1101 can determine which combination of the tactile button switches 304a-e and/or touch sensors 305a-e to activate or receive input from, determine various input combinations from tactile button switches 304a-e and/or touch sensors 305a-e, and associate each input combination with one or more control commands. The controller 1101 may store the programming data in its memory 1102. Accordingly, for a five button zone keypad, five different button sizes can be provided to achieve a large number of button configurations and actions.

As an example, when programmed as a push button, the controller 1101 can turn off touch sensors 305c-e in button zones 415c-e and detect a button press when either of the two tactile switches 304c and 304e are pressed via button 900a. Although the controller 1101 can keep one or more of the touch sensors 305c-e turned on to detect whether button 900a was pressed at its center. When programmed as a side to side rocker button, the controller 1101 can use the touch sensors 305c-e located underneath the button 900a to detect whether the button 900a is pressed on its left side or on its right side, as discussed above. Button 900a can pivot about abutments 910 along vertical axes 914 when it is pressed on its left or right side. Tactile switches 304c and 304e can be depressed via projections 906 to give the user tactile feedback. The controller 1101 may ignore button presses if it detects that the button 900a was pressed on its center, on its top side, or on its bottom side.

A multi-zone button, such as three-zone height button 900a can be also programmed as an up and down rocker, for example to provide an on and off operation. In use, the controller 1101 receives signals from the touch sensors 305c-e located underneath the button 900a to detect whether the button 900a is pressed on its upper side or on its lower side—depending on the proximity of the user's fingers to the touch sensors 305c-e in zones 415c-e. If the button 102 is pressed on its upper side, the upper projection 906 will depress the tactile switch 304c of zone 415c giving the user the tactile feedback, the button 900a will pivot up with respect to the horizontal axis 913, and the controller 1101 will detect that the button 900a was pressed on its upper side via touch sensors 305c. Similarly, if the button 900a is pressed on its lower side, the lower projection 906 will depress the tactile switch 304e of zone 415e giving the user the tactile feedback, the button 902 will pivot down with respect to the horizontal axis 913, and the controller 1101 will detect that the button 900a was pressed on its lower side via touch sensors 305e. The controller 1101 may ignore button presses if it detects that the button 900a is pressed on its center, on its left side, or on its right side. According to another embodiment, another function may be assigned to a center press of the up and down rocker.

FIG. 9C illustrates a rear perspective view of yet another embodiment of a multi-zone height button, such as three-zone height button 900b, that can be attached over a combination of three button zones, such as zones 415c, 415d, and 415e. Instead of two projections, button 900b can comprise a single switch actuating projection 906 proximate to its center to expose a single tactile switch 304d and arrays 305c, 305d, and 305e of nine touch sensors in zones 415c-e. Button 900b may be programmed as a push button, a side to side rocker, an up and down rocker, or any combinations thereof. Whenever the button 900b is pressed, irrespective of the location where it is pressed, the tactile switch 304d is depressed using projection 906. The location of where the button 900b is pressed, whether in its center, top side, bottom side, left side, or right side, can be determined via one of the touch sensors 305c-e located underneath button 900b. When programmed as a push button, the controller 1101 can turn off touch sensors 305c-e in button zones 415c-e and detect a button press using the tactile switch 304d. Although the controller 1101 can keep one or more of the touch sensors 305c-e turned on to detect whether button 900b was pressed at its center. When programmed as a side to side rocker button, the controller 1101 can use the touch sensors 305c-e located underneath the button 900b to detect whether the button 900b is pressed on its left side or on its right side, as discussed above. When programmed as an up and down rocker, the controller 1101 can use the touch sensors 305c-e located underneath the button 900b to detect whether the button 900b is pressed on its upper side or on its lower side. When programmed as an up-down and side to side rocker, the controller 1101 can use the touch sensors 305c-e located underneath the button 900b to detect whether the button 900b is pressed on its upper side, lower side, left side, or right side.

Other multi-zone button configurations may comprise similar configurations to buttons 900a-b, including the two 1002, four 1004, and five 1005 zone height button configurations shown in FIG. 10. The other height buttons sizes can be similarly configured and programmed as discussed above with reference to buttons 900a-b. While the above embodiments are described using five button zones, it should be apparent that a different number of button zones can be utilized with a different number of button height sizes without departing from the scope of the present embodiments. In addition, although separate button caps are illustrated, the buttons for each configuration type shown in FIG. 11 can be interconnected to form a button tree comprising a plurality of interconnected buttons, for example button tree 1200 shown in FIG. 12.

According to another embodiment, as shown in FIG. 6, the center touch sensor in each button zone 415a-e of the PCB 303b can be eliminated, resulting in ten touch sensing points. In such a configuration, center presses can be detected using the center tactile switches 304a-e and/or detecting a close to equal capacitance from both the left and right sensors. FIG. 7 shows yet another embodiment of a PCB 303c comprising a first touch sensor strip 705a and a second touch sensor strip 705b. The first touch sensor strip 705a can longitudinally extend on one side of the column of tactile switches 304a-e across all the button zones 415a-e. The second touch sensor strip 705b can longitudinally extends on the opposite side of the column of tactile switches 304a-e across all the button zones 415a-e. Using such a combination, the controller 1101 can determine which tactile buttons was pressed 304a-e in which zone 415a-e and also which side of the button was pressed in a similar manner as discussed above. A third touch sensor strip can be also placed proximate to the column of tactile switches 304a-e for more accurate center detection.

INDUSTRIAL APPLICABILITY

The disclosed embodiments provide an apparatus, system, and method for a wall mounted control device with inter-changeable buttons that is accomplished through a combination of tactile switches and touch sensors to increase button configurations. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

Additionally, the various methods described above are not meant to limit the aspects of the embodiments, or to suggest that the aspects of the embodiments should be implemented following the described methods. The purpose of the described methods is to facilitate the understanding of one or more aspects of the embodiments and to provide the reader with one or many possible implementations of the processed discussed herein. The steps performed during the described methods are not intended to completely describe the entire process but only to illustrate some of the aspects discussed above. It should be understood by one of ordinary skill in the art that the steps may be performed in a different order and that some steps may be eliminated or substituted.

All United States patents and applications, foreign patents, and publications discussed above are hereby incorporated herein by reference in their entireties.

Alternate Embodiments

Alternate embodiments may be devised without departing from the spirit or the scope of the different aspects of the embodiments.

What is claimed is:

1. A control device for controlling an electrical load comprising:
   a front portion comprising a plurality of button zones, wherein each button zone comprises a tactile switch and at least one touch sensor;
   at least one button cap adapted to attach to the control device over at least one of the button zones such that the at least one button cap is positioned over the at least one touch sensor and interacts with the tactile switch in the at least one of the button zones; and a controller electrically connected to the tactile switches and the touch sensors, wherein the controller determines which button zone and which location of the button zone is actuated in response to a combination of signals received from at least one of the tactile switches and at least one of the touch sensors.

2. The control device of claim 1, wherein the controller receives and stores programming data comprising at least one of a size of the at least one button cap, a function of the at least one of the button zones, a location of the at least one button cap in relation to the at least one of the button zones, and any combinations thereof.

3. The control device of claim 2, wherein the controller uses the programming data to enable or disable one or more of the tactile switches and touch sensors.

4. The control device of claim 2, wherein the controller uses the programming data to assign control commands to a combination of one or more tactile switches and one or more touch sensors.

5. The control device of claim 1, wherein the tactile switch is adapted to provide haptic feedback when the at least one button cap is pressed.

6. The control device of claim 1, wherein the at least one touch sensor comprises one of a capacitive touch sensor, an inductive touch sensor, an infrared touch sensor, a surface acoustic wave touch sensor, and any combinations thereof.

7. The control device of claim 1, wherein the controller determines whether the button zone is being actuated at a left side, at a right side, at an upper side, at a lower side, or at a center of the button zone.

8. The control device of claim 1, wherein each button zone comprises the tactile switch arranged substantially at a center of the button zone and two touch sensors arranged on opposite sides of the tactile switch.

9. The control device of claim 8, wherein each button zone comprises a third touch sensor arranged at the center of the button zone.

10. The control device of claim 1, wherein the at least one button cap comprises a single height button cap adapted to cover a single zone of the plurality of button zones, wherein the controller is adapted to receive programming data comprising a selection of a button zone from the plurality of button zones and a selection of a button type.

11. The control device of claim 10, wherein when the selected button type comprises one of a push button and a side to side rocker.

12. The control device of claim 1, wherein the at least one button comprises a multi height button adapted to cover two or more of the plurality of button zones, wherein the controller is adapted to receive programming data comprising a selection of two or more button zones from the plurality of button zones and a selection of a button type.

13. The control device of claim 12, wherein when the selected button type comprises one of a push button, a side to side rocker, an up and down rocker, and an up-down and side to side rocker.

14. The control device of claim 1, wherein the at least one button cap comprises a plurality of interconnected button camps.

15. The control device of claim 1, wherein the at least one touch sensor comprises a touch sensor pad.

16. The control device of claim 1, wherein the at least one touch sensor comprises a longitudinal touch sensor strip.

17. The control device of claim 1, wherein the touch sensors comprise a first touch sensor strip longitudinally extending on a left side of the front portion across the plurality of button zones and a second touch sensor strip longitudinally extending on a right side of the front portion across the plurality of button zones.

18. The control device of claim 17, wherein the controller determines which button zone is actuated using the tactile switches and which location the button zone is actuated using the first and second touch sensor strips.

19. The control device of claim 1, wherein the at least one button cap and button zone is adapted to provide at least one of a push button, a side to side rocker button, an up and down rocker button, and any combination thereof.

20. A control device for controlling an electrical load comprising:

a front portion comprising a plurality of button zones, wherein each button zone comprises a tactile switch and at least one touch sensor;

at least one button cap adapted to attach to the control device over at least one of the button zones such that the at least one button cap is positioned over the at least one touch sensor and interacts with the tactile switch in the at least one of the button zones; and a controller electrically connected to the tactile switches and the touch sensors, wherein the controller selects a control command in response to a combination of signals received from at least one of the tactile switches and at least one of the touch sensors.

21. A control device for controlling an electrical load comprising:

a front portion comprising a plurality of button zones, wherein each button zone comprises a tactile switch, wherein the front portion further comprises a pair of touch sensors longitudinally extending on opposite sides of the front portion across the plurality of button zones;

at least one button cap adapted to attach to the control device over at least one of the button zones such that the at least one button cap is positioned over at least a portion of each of the touch sensors and interacts with the tactile switch in the at least one of the button zones; and a controller electrically connected to the tactile switches and the touch sensors, wherein the controller selects a control command in response to a combination of signals received from at least one of the tactile switches and at least one of the touch sensors.

\* \* \* \* \*